United States Patent [19]
Sato

[11] Patent Number: 5,450,360
[45] Date of Patent: Sep. 12, 1995

[54] FLASH EEPROM HAVING MEMORY CELL ARRAYS SUPPLIED RESPECTIVELY WITH ERASING VOLTAGE VIA TRANSFER GATES DIFFERENT IN CURRENT CAPABILITY FROM EACH OTHER

[75] Inventor: Toshiya Sato, Tokyo, Japan

[73] Assignee: NEC Corporation, Tokyo, Japan

[21] Appl. No.: 179,362

[22] Filed: Jan. 7, 1994

[30] Foreign Application Priority Data

Jan. 7, 1993 [JP] Japan .................. 5-000925

[51] Int. Cl.$^6$ ............................................. G11C 11/40
[52] U.S. Cl. .................... 365/200; 365/185; 365/218; 365/900; 371/10.2
[58] Field of Search ........... 365/200, 185, 210, 230.03, 365/218, 900; 371/10.1, 10.2, 10.3

[56] References Cited

U.S. PATENT DOCUMENTS

| | | | |
|---|---|---|---|
| 4,648,074 | 3/1987 | Pollachek | 365/210 |
| 4,884,241 | 11/1989 | Tanaka et al. | 365/210 |
| 5,243,570 | 9/1993 | Saruwatari | 365/201 |

FOREIGN PATENT DOCUMENTS 0567356 10/1993 France .
2235999 3/1991 United Kingdom .

*Primary Examiner*—Joseph A. Popek
*Assistant Examiner*—Vu A. Le
*Attorney, Agent, or Firm*—Sughrue, Mion, Zinn, Macpeak & Seas

[57] ABSTRACT

Disclosed herein is a flash type EEPROM which includes a first memory cell array having a plurality of first memory cells, a second memory array having a plurality of memory cells which are smaller in number than the first memory cells, a voltage generator operatively generating an erasing voltage in an erase operation mode, a first transfer gate circuit operatively transferring the erasing voltage to each of the first and a second transfer gate circuit operatively transferring the erasing voltage to each of the second memory cells, the first transfer gate circuit having a current driving capability larger than the current driving capability of the second transfer gate circuit.

11 Claims, 6 Drawing Sheets

FLASH EEPROM HAVING MEMORY CELL ARRAYS SUPPLIED RESPECTIVELY WITH ERASING VOLTAGE VIA TRANSFER GATES DIFFERENT IN CURRENT CAPABILITY FROM EACH OTHER

BACKGROUND OF THE INVENTION

This invention relates to a semiconductor memory device and, more particularly, to an Electrically Erasable Programmable Read-Only-Memory device (EEPROM).

Recently there has been developed a so-called flash EEPROM which is capable of erasing memory data stored in a number of memory cells at the same time. Similarly to a dynamic memory device or a static memory device having high memory capacity, the flash EEPROM also has a memory cell array divided into a plurality of memory cell blocks. In this case, the data erase operation is performed on each of the cell blocks independently. Also in the flash EEPROM, further, there is provided a redundant memory cell block which has one or more redundant bit lines associated with redundant memory cells. As well know in the art, the redundant memory cell block is used in place of the memory cell block having a defective memory cell or cells when such a defective memory cell is accessed. Since the data erase operation is performed in cell block units, however, the redundant memory cell block, which is used in place of a certain one of the memory cell blocks, is required to be erased simultaneously erasing that memory cell block.

Referring to FIG. 5, a typical flash EEPROM includes four memory cell blocks CB1, CB2, CB3 and CB4 and a redundant memory cell block DCB. A row decoder and word driver circuit WD decodes a set of row address signals Add1 from an address buffer AB and selectively drives one of word lines WL (two word lines WL1 and WL2 being shown) which extend over the memory cell blocks CB1, CB2, CB3 and CB4 and the redundant memory cell block DCB. The memory cell blocks CB1, CB2, CB3 and CB4 and the redundant memory cell block DCB are associated with column selectors CS1, CS2, CS3, CS4 and CSD and transfer gate transistors TG1, TG2, TG3, TG4 and TGD, respectively.

Turning to FIG. 6, there is shown a circuit configuration of the memory cell block CB1 and the redundant memory cell block DCB. The other memory cell blocks CB2, CB3 and CB4 have the same configuration as the memory cell block CB1. The memory cell block CB1 has a plurality of memory cell transistors MCT111, MCT112, MCT11m, MCT121 and MCT122 arranged in rows and columns and each of them has a gate connected to one of the word lines WL, a drain connected to one of bit lines BL11, BL12, and BL1m and a source connected to a source line SL1 which is in turn connected to a common source line SL via the associated transfer gate transistor TG1. Thus, each of the memory cell block CB comprises m bit lines BL11, BL12, ..., BL1m and one source line SL1.

On the other hand, the redundant memory cell block DCB comprises two redundant bit lines BLD1 and BLD2 and a plurality of memory cell transistors MCTD11, MCTD12. Each of the transistors has a gate connected to an associated word line, a drain connected to one of the two redundant bit lines BLD1, BLD2 and a source connected to a source line SLD.

The memory cell transistors MCT111, MCT112, MCT11m, MCT121 and MCT122 in each memory cell block CB and the memory cell transitors MCTD11, MCTD12 in the redundant memory cell block DCB are formed in the same constitution. In detail, as shown in FIG. 7, each of the memory cell transistors and the redundant memory cell transistors is of a MOS-type formed in a semiconductor substrate SUB and having a stacked type gate electrode SGE including a floating gate FGE and a control gate CGE which is connected to the word line WL1. A source region SR and a drain region DR thereof are connected to a source line SL1 and the bit line BL11, respectively.

The operation of this device will be explained on the condition that a memory cell transistor, for example the transistor MCT112, is defective. In this case, the column address designating the defective memory transistor MCT112 is programmed in an address latch circuit AL as an defective column address signal AddD1. A comparator COMP compares an input column address signal Add2 with the defective column address signal AddD1 and, if they are coincident to each other replaces, the address signal Add2 by the column address signal AddR1. Therefore, one of the redundant memory cell, the memory cell transistors MCTD11 for example, is used in place of the defective memory cell transistor MCT112.

In a program mode operation, in a case where the address signal Add which indicates the memory cell transistor MCT111 is input, the row decoder and word driver circuit WD drives the word line to a program voltage Vp, that is about 12V and supplied from a voltage controller VC1. The comparator COMP outputs the address signal Add2 as a column address signal Add3 to the column decoder CD. The program amplifier PA supplies the power voltage Vcc, that is about 5 V, via a data line DL to the column selectors CS1, CS2, CS3, CS4 and CSD. The column decoder CD decodes the address signal Add3 and outputs a column selection signal YS to the column selector CS1 which drives the bit line BL11 to the voltage Vcc. At the same time, the transfer gate transistor TG1 is turned conductive according to a control signal SC1 from a source line controller SCC responding to the address signal Add3. The voltage controller VC2 supplies the ground voltage Vgnd to a common source line SL. As a result, the channel current flows in the designated memory cell transistor, causing channel hot electrons (CHE) in the vicinity of the drain region DR thereof. These channel hot electrons are transported to the floating gate electrode FGE owing to the high voltage Vp at the control gate electrode CGE and make the threshold voltage Vt of the memory cell transistor high, for example, from about 2 V in a non-programmed state to about 7 V in a programmed state. This programmed state corresponds to a logical memory data, for example, "1". The program mode operation on any other memory cell block is performed in the same manner as above. In this device, since the each transfer gate transistor TG1, TG2, TG3, TG4 and TGD is needed to transfer the channel current of one memory cell transistor MCT111, MCT112, ..., MCTD11 or MCTD12 only, it can be formed in a very small and common size having a same driving capability for the sake of the manufacturing processes and the integration density of the device.

In a read mode operation to read the data in the memory cell transistor MCT111, the word line WL1 is driven to the voltage Vcc and the bit line BL11 is connected to the data line DL in a same manner as above. A read amplifier RA supplies a read voltage Vr, that is about 1V, to the data line DL. The voltage controller VC2 supplies the ground voltage Vgnd to the source line SL1 via the common source line SL and the transfer transistor TG1. In this case, since the memory cell transistor MCT111 has its threshold voltage Vt about 7 V, no channel current flows therein and the voltage level at the bit line BL11 and the data line DL are maintained at the read voltage Vr. The read amplifier RA detects the voltage level at the data line DL and outputs a high level read data signal representing the logical memory data "1".

In an erase mode operation, in a case where the memory cell block CB1 is to be erased, since the redundant memory cell block DCB works as a part of the memory cell block CB1, the redundant memory cell block DCB have to be also erased. Therefore, the input address signal Add2 indicates the memory cell block CB1. The comparator COMP compares the information in the address signal Add2 indicating the memory cell block CB1 with that in the defective address signal AddD1 indicating the memory cell block CB1 so as to output the address signal Add3 which designates both of the memory cell block CB1 and the redundant memory cell block DCB. Therefore, the column selectors CS1 and CSD connect all bit lines BL11, BL12 and redundant bit lines BLD1, BLD2 therein to the data line DL which is in turn supplied with the ground voltage Vgnd from an erase controller EC. The source lines SL1 and SLD are supplied with an erase voltage Ve, that is about 12 V, from the voltage controller VC2 via the common source line SL and the transfer gate transistors TG1 and TGD. On the other hand, the row decoder and word driver circuit WD maintains all the word lines WL1 and WL2 at the ground voltage Vgnd. The semiconductor substrate SUB is maintained at the ground voltage Vgnd. Therefore, the electrons stored in the floating gate electrode FGE of the memory cell transistors MCT111, MCT112, MCT11m, MCT121 and MCT122 and the redundant memory cell transistors MCTD11 and MCTD12 which are in the programmed state are transported to the source region SR of them by the FN tunneling effect. Thus the all memory cell transistors MCT111, MCTD11, etc. in the cell blocks CB1 and DCB are regulated to be in the non-programmed state. In this case, according to the conventional memory device, it was considered that the current consumption in the erase mode operation is caused only by the FN tunneling effect in each memory cell transistor, which causes generally very little current. Therefore, while the transfer gate transistors TG1 and TGD are needed to transfer the currents caused by a plurality of memory cell transistors MCT111, MCTD11, etc. to or from the common source line SL, the transfer gate transistors TG1 and TGD has actually been formed in the common and very small size as mentioned above.

However, in this conventional device, in respect to the present invention, it is confirmed that the erase voltage Ve, which is needed to be a high level voltage such as 12 V to cause the FN tunneling, also causes a current between the source region SR and the semiconductor substrate SUB. This current is considered as a result of a tunneling effect at the PN junction between the source region SR and the substrate SUB. In particular, when the floating gate electrode FGE is filled with electrons and at a negative voltage, that is, in a programmed state, this current (referred as to PN tunneling current hereinafter) is more effectively caused and tends to be considerably larger than the FN tunneling current. Therefore, in the erase mode operation, each of the memory cell transistors MCT111, MCTD11, etc., in particular in the programmed state, causes a large current, making the total current to be transferred via each of the source lines SL1, SL2, SL3, SL4 and SLD very large. Accordingly, since the transfer gate transistors TG1, TG2, TG3, TG4 and TGD are formed in a common small size and have a very small driving capability intended for maintaining the respective source lines SL1, . . . , SL4 and SLD at the erase voltage Ve, the voltage levels at the source lines SL1, . . . , SL4 and SLD are decreased from the erase voltage Ve during the erase mode operation. Moreover, the voltage decrease at each of the source lines SL1, SL2, SL3 and SL4 is larger than that at the source line SLD owing to the large number of the memory cell transistors MCT111, MCT112, MCT11m, etc. connected thereto. Therefore, as a result, in this device, the erase mode operation on the memory cell block CB1, CB2, CB3 or CB4 needs considerably long time in comparison with the redundant memory cell block DCB. Accordingly, in a case where one of the memory cell blocks CB1, CB2, CB3 and CB4 and the redundant memory cell block DCB should be erased at the same time as explained above, if the erase mode operation is performed for a enough time to erase all memory cell transistors MCT111, MCT112, MCT11m, etc. in the memory cell block CB1, CB2, CB3 or CB4, the memory cell transistors MCTD11 and MCTD12 in the redundant memory cell block DCB is over erased, that is, the electrons in the floating gate electrode FGE thereof are transported to the source region SR more than the necessitate so that the redundant memory cell transistors MCTD11 and MCTD12 becomes depression state. Once any memory cell transistors MCTD11 and MCTD12 becomes depression state, the redundant bit lines BLD1 and BLD2 associated therewith are continuously electrically connected to the source line SLD regardless of the voltage at the word lines WL1 and WL2 so that they fails to function normally, making the total reliability of the device extremely low. On the other hand, if the erase mode operation is performed for a time only enough to erase the memory cell transistors MCTD11 and MCTD12 in the redundant memory cell block DCB, the memory cell transistors MCT111, MCT112, MCT11m, etc. in the memory cell block CB1, CB2, CB3 or CB4 are not erased sufficiently, preventing the normal function of the device.

SUMMARY OF THE INVENTION

Therefore, an object of the present invention is to provide a semiconductor memory device with a redundant memory cell block in which a data erasing operation is performed with a high reliability.

A memory device according to the present invention is characterized in that a transfer gate provided for a memory cell array has a current driving capability larger than the current driving capability of a transfer gate provided for a redundant memory cell array.

With this feature, a required current is supplied to the cell array with suppressing an excessive current from flowing the redundant memory cell array.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE PREFERRED EMBODIMENTS

Figure 1:
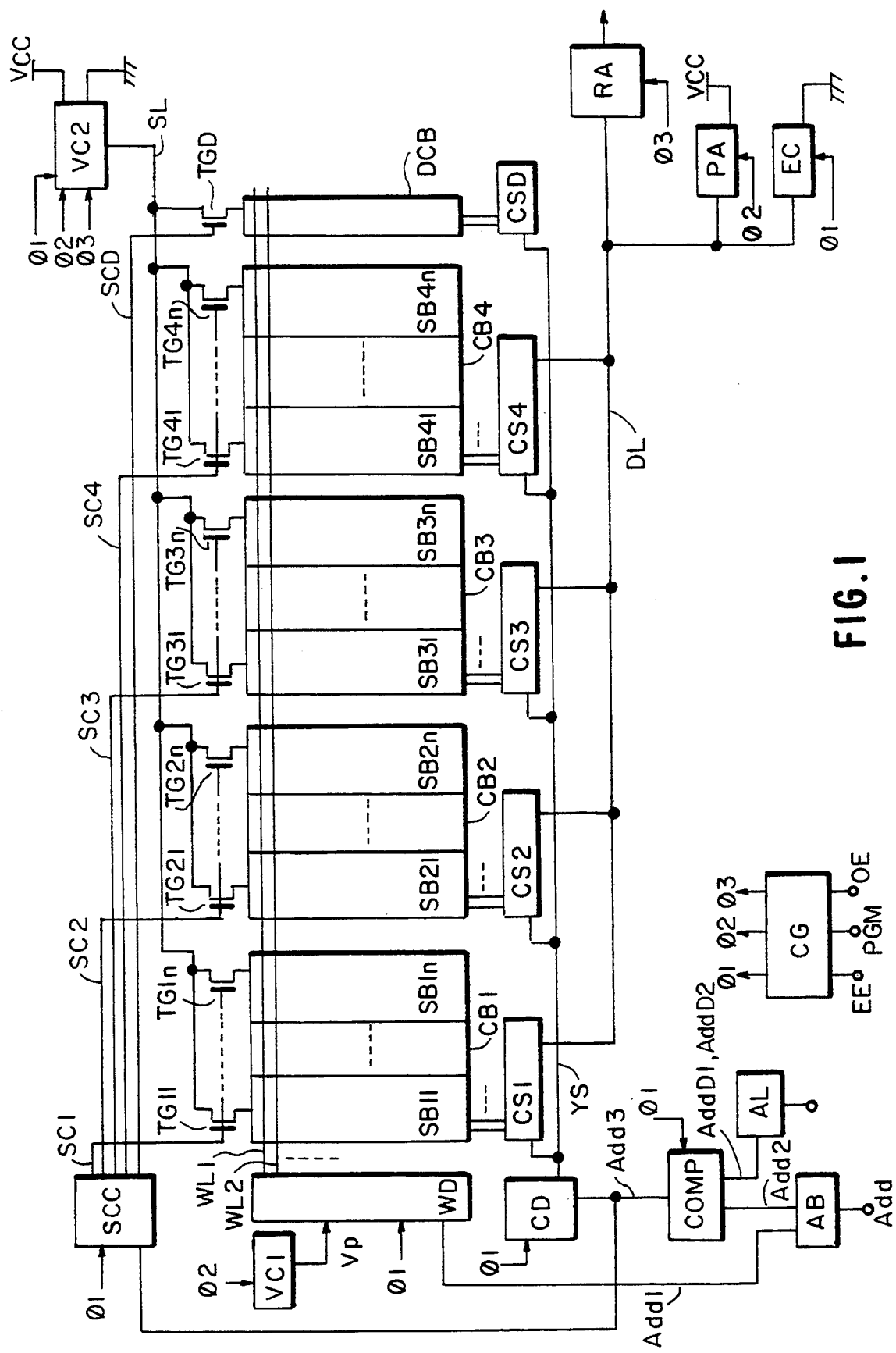
FIG. 1 is a block diagram showing a memory device according to an embodiment of the present invention.
Figure 2:
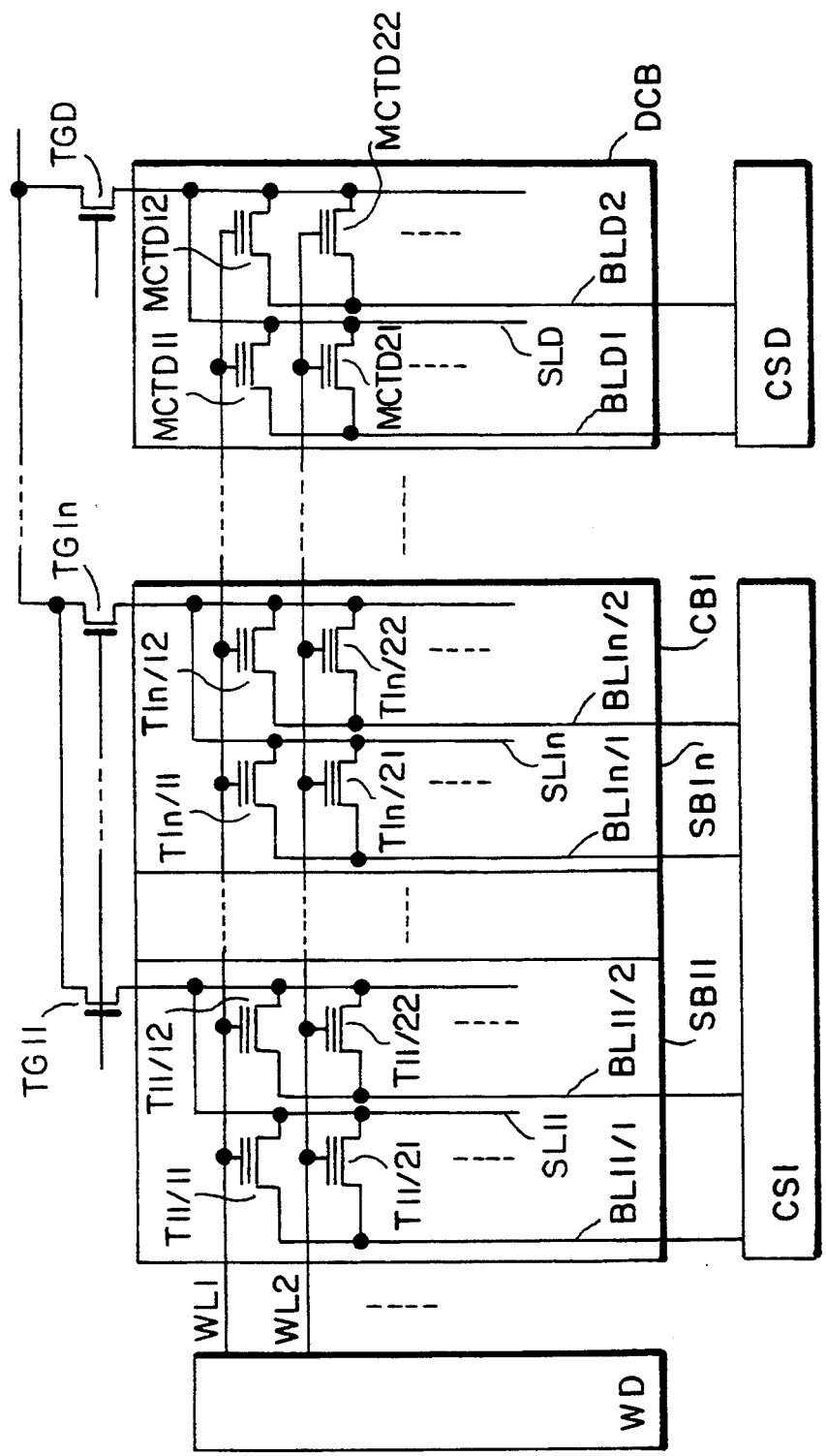
FIG. 2 is a circuit diagram indicative of one of memory cell blocks and a redundant memory cell block shown in FIG. 1.
Figure 7:
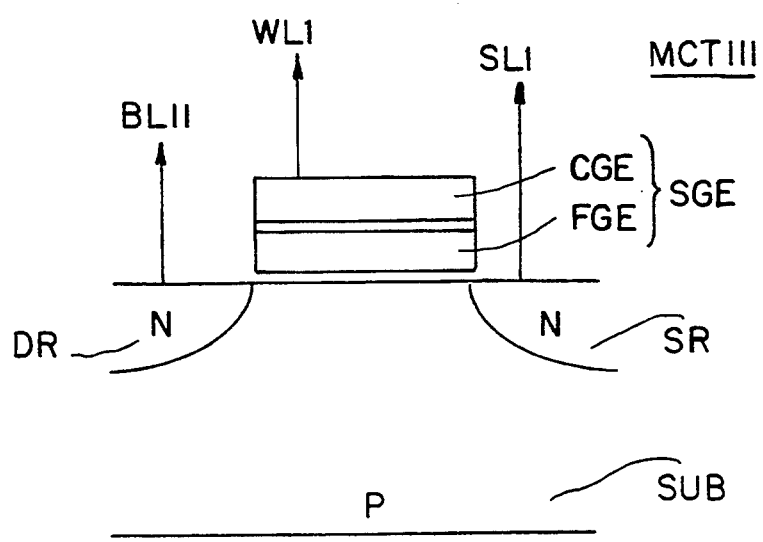
FIG. 7 shows a cross sectional view of a typical memory cell transistor used in an EEPROM.

Referring now to FIGS. 1 and 2, a memory device according to an embodiment of the present invention has the same constitution as the conventional device except that each of the memory cell blocks CB1, CB2, CB3 and CB4 comprises a plurality of sub-blocks SB11, SB1n, SB21, SB2n, SB31, SB3n, SB41 and SB4n each associated with one of transfer gate transistors TG11, TG1n, TG21, TG2n, TG31, TG3n, TG41 and TG4n as shown in FIG. 1. The memory cell block CB1 and the redundant memory cell block DCB are shown in FIG. 2 in detail. The other memory cell blocks CB2, CB3 and CB4 has the same configuration as the memory cell block CB1. As shown in FIG. 2, the redundant memory cell block DCB includes two redundant bit lines BLD1 and BLD2 whereas the memory cell block CB1 comprises n sub-blocks SB11, . . . , SB1n each including two bit lines BL11/1 and BL11/2, . . . , BL1n/1 and BL1n/2. That is, the memory cell block CB1 comprises a multiple number of memory cell transistors T11/11, . . . , T11/22 as those in the redundant memory cell block DCB. Each of the sub-blocks SB11, . . . , SB1n in the memory cell block CB1 is associated with a source line SL11, . . . , SL1n, respectively. In each of the sub-blocks SB11, . . . , SB1n, for example in the sub-block SB11 as an typical one, each memory cell transistors T11/11, T11/12, T11/21 and T11/22 is formed in the same manner as shown in FIG. 7 and has its control gate electrode CGE, source region SR and drain region DR connected to one of word lines WL1 and WL2, one of bit lines BL11/1 and BL11/2 and the source line SL11, respectively. The source line SL11 is selectively connected to the common source line SL via the transfer gate transistor TG11. Therefore, in this device, according to this configuration, each of the transfer gate transistors TG11, TG1n, TG21, TG2n, TG31, TG3n, TG41 and TG4n associated with the sub-blocks SB11, SB1n, SB21, SB2n, SB31, SB3n, SB41 and SB4n respectively and the transfer gate transistor TGD associated with the redundant memory cell block DCB corresponds to the same number of the bit lines, that is, the same number of the memory cell transistors, so as to be formed in a common small size having a common driving capability as described below.

Also in this device, if a memory cell transistor, for example the transistor T11/11, is defective, the column address signal designating that defective transistor is preliminary detected and programmed in the address latch circuit AL as defective address signal. Therefore, an input column address signal Add2 which equals to the defective address signal is replaced by the redundant column address signal AddR1 or AddR2. That is, the bit line BL11/1 is replaced by the redundant bit line BDL1 or BDL2.

Then the program mode operation will be described on the same condition that the bit lines BL11/1 is replaced by the redundant bit line BLD1. At first the clock generator CG outputs a high level control signal $\phi 2$ according to a external input signal PGM. An address buffer AB is supplied with an address signal Add and outputs the row address signal Add1 to the row decoder and word driver circuit WD and a column address signal Add2 to the comparator COMP. At the same time, the voltage controller VC1 supplies the program voltage Vp, that is about 12 V, according to the control signal $\phi 2$ to the row decoder and word driver circuit WD which drives the word line WL1 to the voltage Vp according to the row address signal Add1. The comparator COMP compares the input column address signal Add2 with the defective address and replaces the address signal by the redundant address signal AddR1, as described hereinbefore. The redundant memory cell block DCB thereby works as a part of the memory cell block CB1, that is, for example, in place of the sub-block SB11. Meanwhile, a program amplifier PA is activated by the control signal $\phi 2$ to supply a power voltage Vcc of the device, that is about 5 V, via a data line DL to the column selectors CS1, CS2, CS3, CS4 and CSD. The column decoder CD decodes the address signal Add3, which indicates the redundant bit line BLD1 in place of the bit line BL11/1, and outputs a column selection signal YS to the column selector CSD which drives the bit line BLD1 to the voltage Vcc. On the other hand, a source controller SCC also decodes the address signal Add3 and outputs a control signal SCD to the transfer gate transistor TGD which is turned to be conductive state according thereto. The voltage controller VC2 supplies the ground voltage Vgnd according to the control signal $\phi 2$ to a common source line SL which is electrically connected to the source line SLD in the redundant memory cell block DCB via the transfer gate transistor TGD. Therefore, the channel current flows in the redundant memory cell transistor MCTD11, causing channel hot electrons (CHE) in the vicinity of the drain region DR thereof. These channel hot electrons are transported to the floating gate electrode FGE owing to the high voltage Vp at the control gate electrode CGE, making the threshold voltage Vt of the redundant memory cell transistor MCTD11 high, for example, from about 2 V in non-programmed state to about 7 V in programmed state, as mentioned above. This programmed state corresponds to, for example, the logical memory data "1". In this case, likely to the conventional device, the transfer gate transistor is only needed to transfer the current caused by one memory cell transistor MCT11 so that it can be formed in a small size.

In a read mode operation, in the same case where the address signal Add which indicates the memory cell transistor MCT11/11 is input, the clock generator CG outputs a control signal $\phi 3$ according to a external input signal OE which activates the read amplifier RA to supply a read voltage Vr, that is about 1 V, to the column selector CSD via the data line DL. The column decoder CD and the column selector CSD select the bit line BLD1 in the same manner as the program mode operation and supplies it with the read voltage Vr. The word line WL1 is also selected and driven to the voltage Vcc according to the address signal Add1 from the address buffer AB and thus the memory cell transistor MCTD11 is selected. In this case, the source line controller SCC also select the transfer gate transistor TGD according to the address signal Add3. The voltage controller VC2 outputs the ground voltage Vgnd according to the control signal $\phi 3$. Therefore the source line SLD is maintained at the ground voltage. In this case, since the memory cell transistor MCTD11 is programmed and has its threshold voltage Vt about 7 V, no channel current flows therein. Accordingly, the voltage level at the bit line BLD1 and the data line DL are maintained at the read voltage Vr so that the read amplifier RA detects the voltage level at the data line DL and outputs a high level read data signal representing the logical memory data "1". However, in this read mode operation, if the selected memory cell transistor MCTD11 is in the non-programmed state, the channel current occurs therein, causing the voltage decrease at the bit line BLD1 and the data line DL so that the read amplifier RA outputs a low level read data signal representing the logical memory data "0".

In an erase mode operation, in a case where the memory cell block CB1 is to be erased, as in the same manner as the conventional device explained above, since the redundant memory cell block DCB works in place of the sub-block SB11 in the memory cell block CB1, the redundant memory cell block DCB also have to be erased at the same time. That is, at first the clock generator CG outputs a control signal $\phi 1$ according to the external input signal EE to the comparator COMP which is also supplied with an address signal Add2 from the address buffer AB. In this case, the address signal Add2 indicates the memory cell block CB1. Therefore, the comparator COMP, according to the control signal $\phi 1$, compares the information indicating the memory cell block CB1 included in the defective address signals AddD1 and AddD2 with that in the input address signal Add2. That is, each of the defective address signals AddD1 and AddD2 consists of a block address signal AddK1 or AddK2 which indicates the memory cell block CB1 and a bit line address signal AddT1 or AddT2 which indicates one of the bit lines in the cell block CB1. The comparator COMP, being activated by the control signal $\phi 1$, detects the block address signal AddK1 or AddK2 in the defective address signal AddD1 or AddD2 respectively to compare it with the input address signal Add2 and, if they are cooncident with each other, outputs the address signal Add3 which indicates both of the memory cell blocks CB1 and the redundant memory cell block DCB. The column decoder CD, in response to the control signal $\phi 1$ and the address signal Add3, outputs the column selection YS to the memory cell block CB1 and the redundant memory cell block DCB which select all bit lines BL11/1, BL11/2, ..., BL1n/2 and redundant bit lines BLD1, BLD2 therein and connect them to the data line DL. The data line DL is supplied with the ground voltage Vgnd from a erase controller EC which is supplied with the control signal $\phi 1$. Meanwhile, the source line controller SCC, according to the control signal $\phi 1$ and the address signal Add3, outputs the control signals SC1 and SCD to the transfer gate transistors TG11, ..., TG1n and the transfer gate transistor TGD respectively which turn to be conductive according thereto. The voltage controller VC2 outputs the erase voltage Ve, that is about 12 V, according to the control signal $\phi 1$ to the common source line SL. Accordingly, each of the source lines SL11, ..., SL1n and SLD is connected to the common source line SL via the transfer gate transistor TG11, ..., TG1n and TGD respectively and supplied with the voltage Ve from the voltage controller VC2. At the same time, the row decoder and word driver circuit WD maintains all the word lines WL1 and WL2 at the ground voltage Vgnd according to the control signal $\phi 1$. In this case, the semiconductor substrate SUB is maintained at the ground voltage Vgnd. Therefore, the electrons stored in the floating gate electrode FGE of each of the memory cell transistors T11/11, ..., T1n/12 in the memory cell block CB1 and the redundant memory cell transistors MCTD11, ..., MCTD22 in the redundant memory cell block which are in the programmed state are transported to the source region RE by the FN tunneling.

In this erase mode operation, as mentioned above, the PN tunneling current occurs in the memory cell transistors T11/11, ..., T1n/22 and MCTD11, ..., MCTD22, in particular in the programmed state, so that the memory cell block CB1 causes the considerably larger amount of total current which is to be transferred to the common source line SL than the current caused by the redundant memory cell block which is also to be transferred to the common source line SL. However, according to this embodiment, since the memory cell transistors T11/11, ..., T1n/22 in the memory cell block CB1 is divided into n sub-blocks SB11, ..., SB1n each associated with a respective transfer gate transistor TG11, ..., TG1n and including the same number of memory cell transistors T11/11, ..., T11/22 as the redundant memory cell block DCB, which is associated with a transfer gate transistor TGD, and since the transfer gate transistors TG11, ..., TG1n and TGD are formed in the same size having the same driving capability as each other as mentioned above, the source lines SL11, ..., SL1n and SLD are maintained at the same voltage level as each other and as nearly the same voltage level as the erase voltage Ve. Thus the all memory cell transistors T11/11, ..., T11/22 and MCTD11, ..., MCTD22 in the memory cell block CB1 and the redundant memory cell block DCB are regulated to be in the non-programmed state at the same time.

Therefore, according to this embodiment, while the memory cell block CB1 and the redundant memory cell block DCB comprises the different number of memory cell transistors T11/11, ..., T1n/22 and MCTD11, ..., MCTD22 from each other, the voltage at the source region RE of each of the memory cell transistors T11/11, ..., T1n/22 and MCTD11, ..., MCTD22 are maintained at the same level during the erase mode operation so that the erase mode operation is performed in such a manner that all the memory cell transistors T11/11, ..., T1n/22 and MCTD11, ..., MCTD22 to be erased are sufficiently and normally erased at the same time. As a result, the device of this embodiment can utilizes the redundant memory cell block safely, making the total operation reliability thereof very high.

Figure 3:
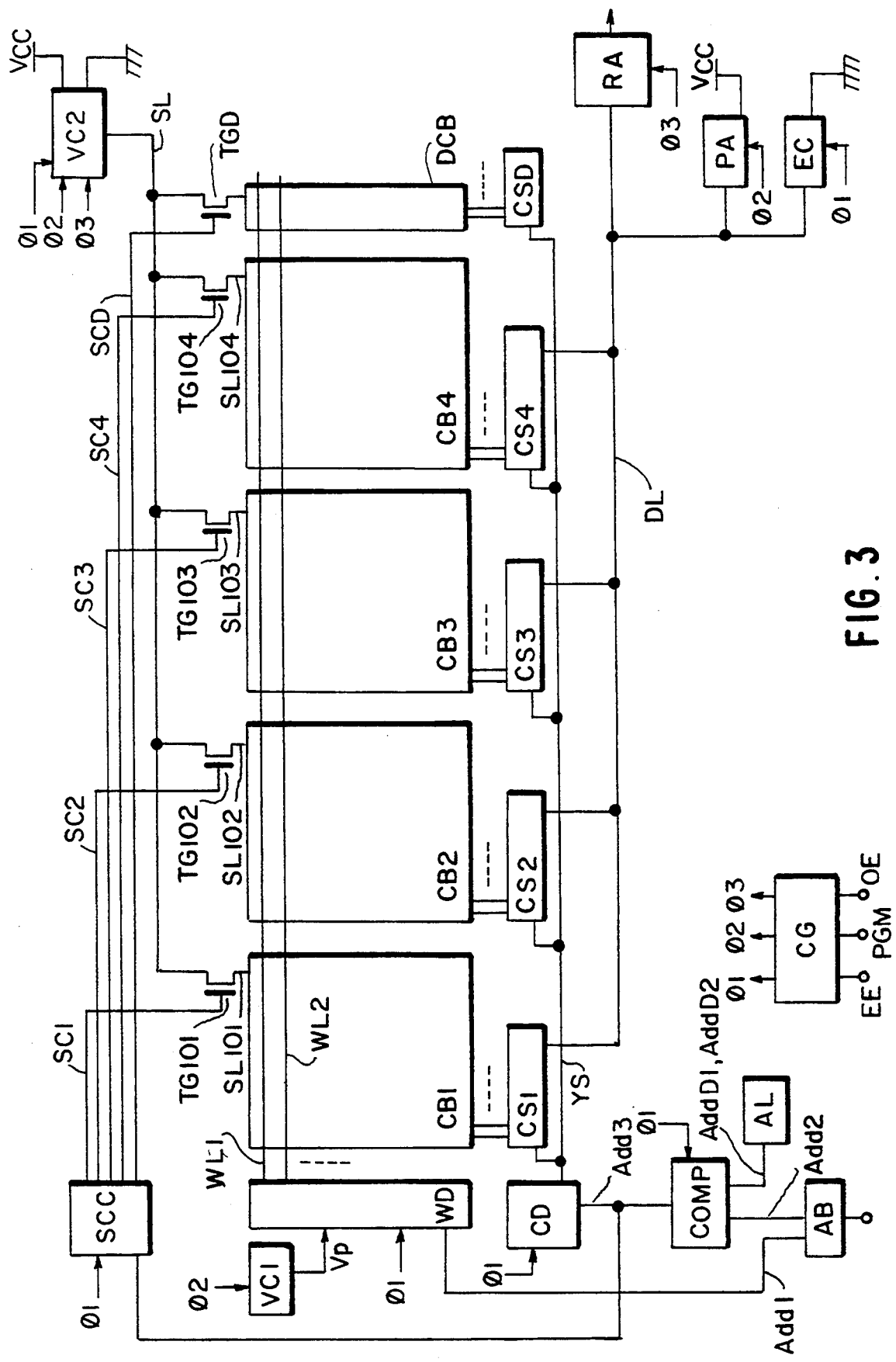
FIG. 3 is a block diagram showing a memory device according to another embodiment of the present invention.
Figure 4:
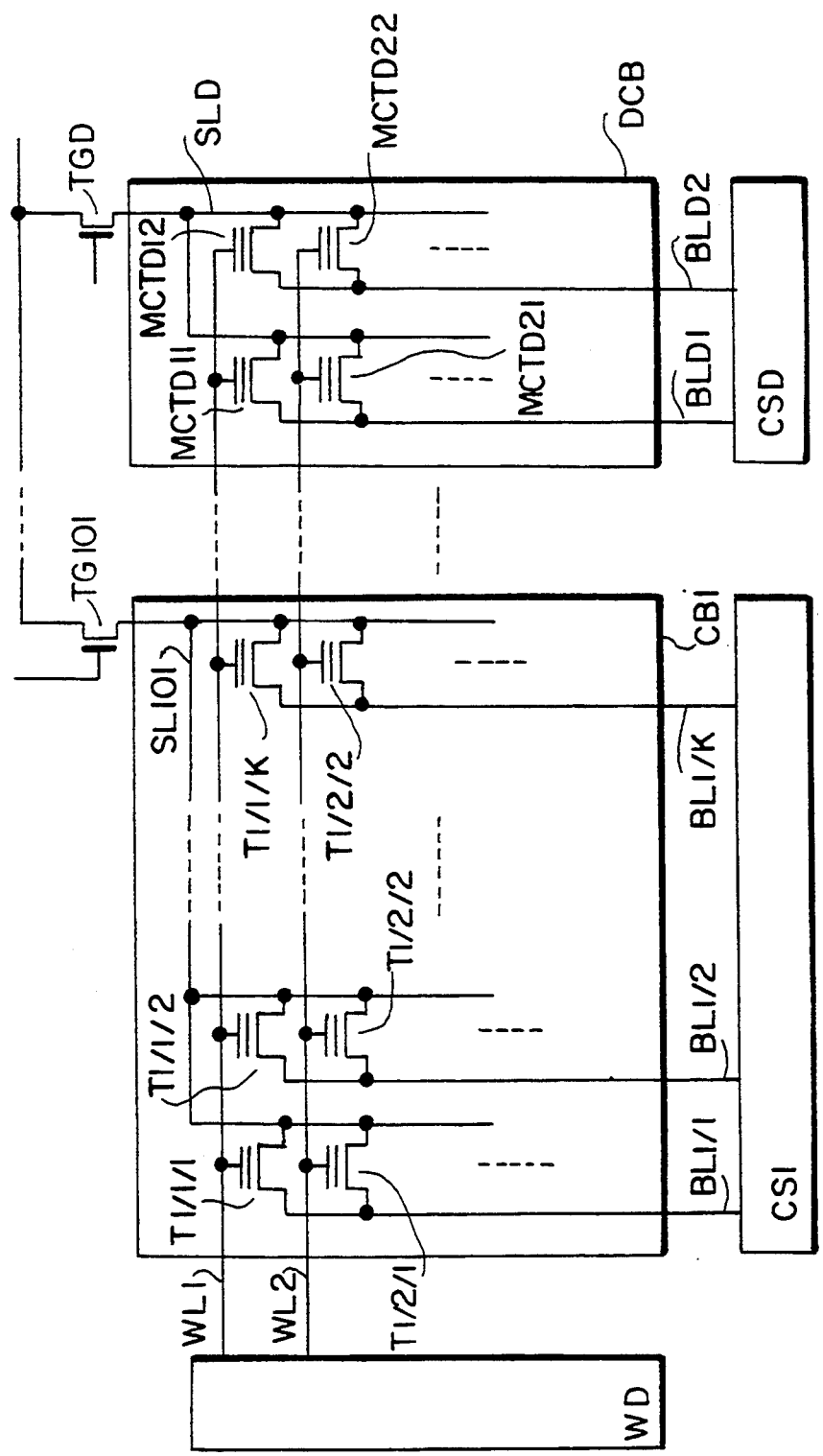
FIG. 4 is a circuit diagram indicative of one of memory cell blocks and a redundant memory cell block shown in FIG. 4.
Figure 5:
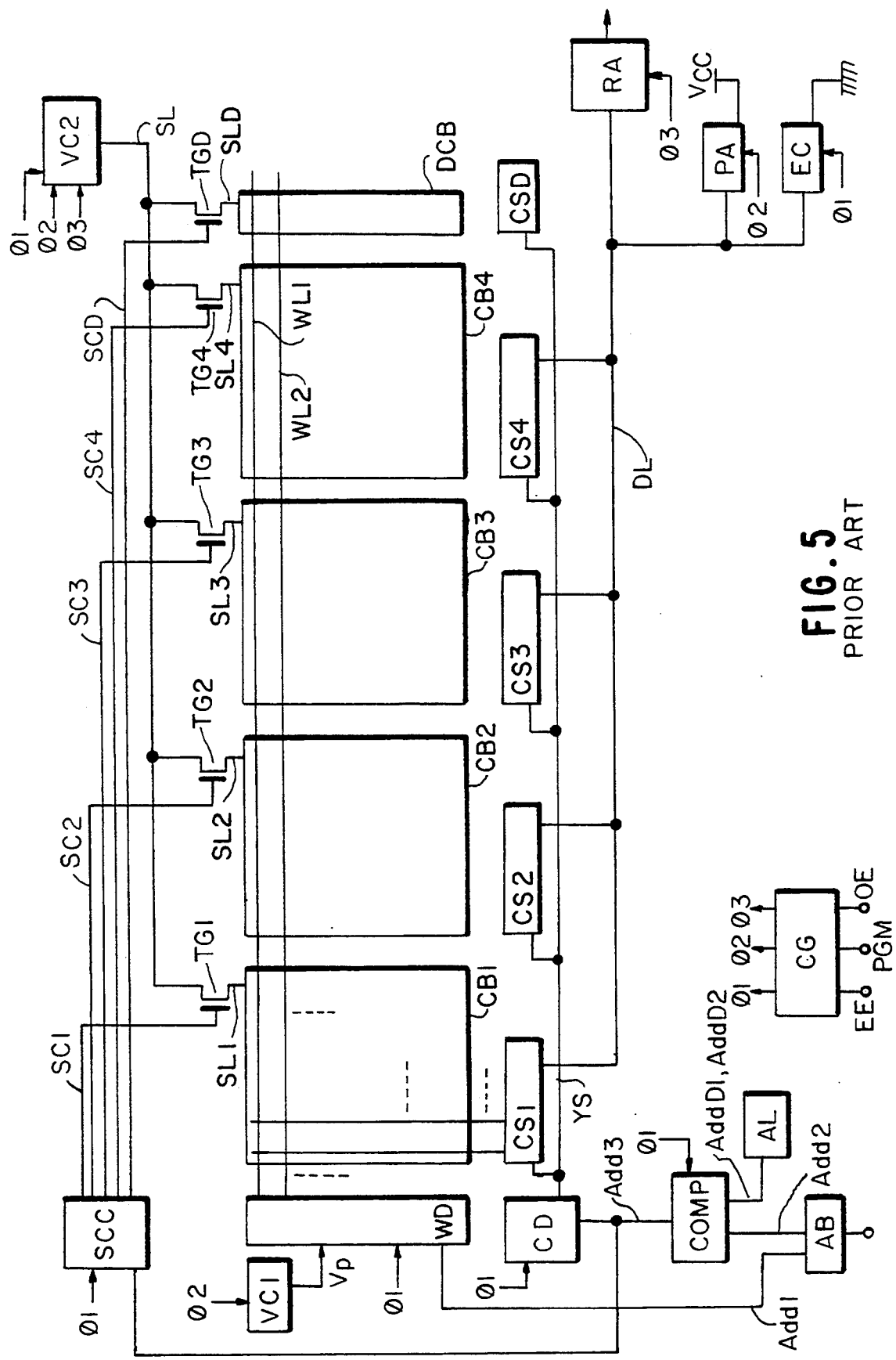
FIG. 5 is a block diagram showing a conventional EEPROM device.
Figure 6:
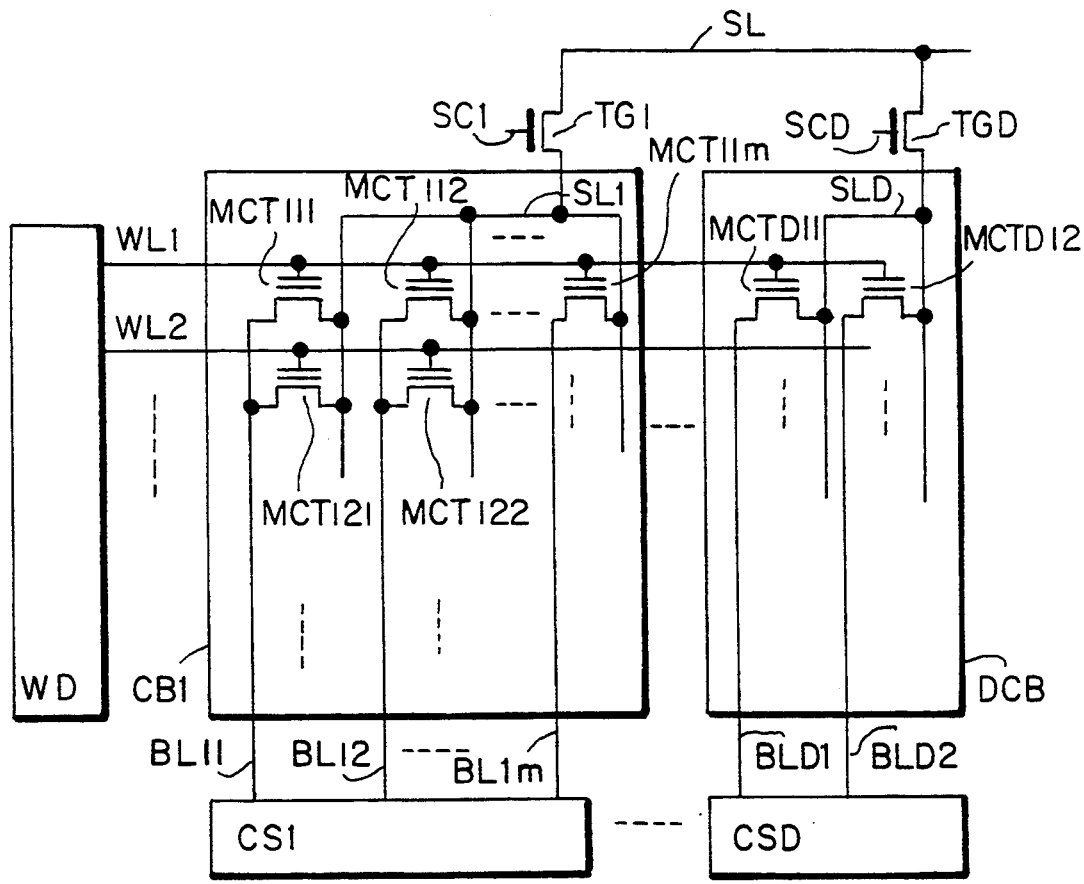
FIG. 6 shows a circuit configuration of one of memory cell block and a redundant memory cell block shown in FIG. 5.

FIG. 3 shows a memory device according to another embodiment of the present invention. This device has nearly the same constitution as the device of the first embodiment described above except that each of the memory cell block CB1, CB2, CB3 and CB4 comprises a respedtive source line SL101, SL102, SL103 or SL104 each connected to a respective transfer gate transistor TG101, TG102, TG103 or TG104. Each of the memory cell blocks CB1, CB2, CB3 and CB4, for example CB1 as a typical one, comprises k bit lines BL1/1, . . . , BL1/k whereas the redundant memory cell block DCB comprises two bit lines BLD1 and BLD2. That is, the memory cell block CB1 comprises k/2 times number of memory cell transistors T1/1/1, . . . , T1/2/k as the redundant memory cell block DCB as shown in FIG. 4. Moreover, the transfer gate transistor T101 has a k/2 times large driving capability as the transfer gate transistor TGD associated with the redundant memory cell block DCB. The memory cell blocks CB2, CB3 and CB4 and the transfer gate transistors TG102, TG103 and TG104 have the same configuration as the memory cell block CB1 and the transfer gate transistor TG101. The driving capabilities of the transfer gate transistors TG101, TG102, TG103, TG104 and TGD, which are of MOS type, are determined by adjusting their gate widths, gate lengths or impurity concentrations at the channel regions.

The operations of this device are almost the same as those of the device of the first embodiment. Therefore, according to this constitution, in the erase mode operation, for example in a case where the memory cell block CB1 and the redundant memory cell block DCB have to be erased at the same time, while those two memory cell blocks comprise the different number of memory cell transistors T1/1/1, . . . , T1/2/k and MCTD11, . . . , MCTD22 from each other, the voltage level at the source lines SL101 and SLD are maintained at the same level as each other and as the erase voltage Ve, in spite of the PN tunneling currents therein. This device is also capable of utilizing the redundant memory cell block in safety and raising the operational reliability thereof.

It is apparent that the present invention is not limited to the above embodiments but may be modified and changed without departing from the scope and spirit of the invention.

What is claimed is:

1. A semiconductor memory device comprising a first memory cell array including a plurality of first memory cells, a second memory cell array including a plurality of second memory cells which are smaller in number than said first memory cells, a voltage generator operatively generating a predetermined voltage, first means coupled between said first memory cell array and said voltage generator for operatively supplying said predetermined voltage to each of said first memory cells, and second means coupled between said second memory cell array and said voltage generator for operatively supplying said predetermined voltage to each of said second memory cells, said first means having a first current capability and said second means having a second current capability that is smaller than said first current capability.

2. The memory device as claimed in claim 1, wherein said first means includes a plurality of first transfer gate transistors each controlled by a first control signal to be brought into one of conductive and non-conductive states simultaneously with one another to thereby provide said first current capability and said second means includes a second transfer gate transistor controlled by a second control signal to thereby provide said second current capability.

3. The memory device as claimed in claim 2, wherein each of said first transfer gate transistors is connected to associated ones of said first memory cells, said associated ones of said first memory cells being equal in number to said second memory cells connected to said second transfer gate transistor, and each of first transfer gate transistors having a current capability substantially equal to a current capability of said second transfer gate transistor.

4. The memory device as claimed in claim 1, wherein said first means includes a first transfer gate transistor having said first current capability and said second means includes a second transfer gate transistor having said second current capability.

5. A semiconductor memory device comprising a memory cell array having a plurality of word lines, a plurality of bit lines and a plurality of memory cells each connected to one of said word lines and one of said bit lines, said memory cell array being divided into a plurality of first memory cell blocks and a second memory cell block, said second memory cell block having a predetermined number of said memory cells and a second signal line connected to each of said memory cells contained therein, each of said first memory cell blocks being divided into a plurality of sub-blocks each having said predetermined number of said memory cells, each of said sub-blocks further having a first signal line connected to each of said memory cells contained therein, a voltage generator operatively generating a control voltage at an output node thereof, a plurality of first transfer gates each connected between an associated one of said first signal lines of said sub-blocks and said output node of said voltage generator, and a second transfer gate connected between said second signal line and said output node of said voltage generator.

6. A semiconductor memory device according to claim 5, wherein each of said memory cells comprises a memory cell transistor having a control gate, a drain and a source connected to an associated one of said word lines, an associated one of said bit lines and an associated one of said first and second signal lines, respectively.

7. A semiconductor memory device according to claim 5, wherein each of said first transfer gates is substantially equal in current capability to said second transfer gate.

8. A semiconductor memory device according to claim 5, wherein said first transfer gates are divided into a plurality of groups each corresponding to an associated one of said sub-blocks, the first transfer gates in each of said groups being made conductive simultaneously with one another.

9. A semiconductor memory device comprising a memory cell array having a plurality of word lines, a plurality of bit lines and a plurality of memory cells each connected to one of said word lines and one of said bit lines, said memory cell array being divided into a plurality of first memory cell blocks each having a first number of said memory cells and a second memory cell block having a second number of said memory cells, said first number being larger than said second number, each of said first memory cell blocks further having with a first signal line connected to each of said memory cells contained therein, said second memory cell block further having a second signal line connected to each of said memory cells contained therein, a voltage generator operatively generating a control voltage at an output node, a plurality of first transfer gates each connected between an associated one of said first signal lines and said output node of said voltage generator, and a second transfer gate connected between said second signal line and said output node of said voltage generator, said first transfer gate having a first driving capability, said second transfer gate having a second driving capability, and a ratio of said first driving capability to said second driving capability being equal to a ratio of said first number to said second number.

10. A semiconductor memory device comprising a memory cell array including a plurality of first memory cells, a redundant memory cell array including a plurality of redundant memory cells which are smaller in number than said first memory cells, an access circuit responding to address information designating a defective one of said first memory cells and accessing one of said redundant memory cells in place of said defective one of said first memory cells, a voltage generator operatively generating a predetermined voltage, first circuit means coupled between said memory cell array and said voltage generator for operatively supplying said predetermined voltage to each of said first memory cells with a first current capability, and second circuit means coupled between said redundant memory cell array and said voltage generator for supplying said predetermined voltage to each of said redundant memory cells with a second current capability that is smaller than said first current capability.

11. A semiconductor device comprising a plurality of memory cell array blocks each including a plurality of first memory cells, a redundant memory cell array block including a plurality of redundant memory cells, each of said first memory cells and said redundant memory cells comprising an electrically programmable and erasable transistor having a floating gate and a control gate, means responsive to address information designating a defective one of said first memory cells in one of said memory cell array blocks for accessing one of said redundant memory cell in said redundant memory cell array block in place of said defective one of said first memory cells in said one of said memory cell array blocks, first erasing means for simultaneously erasing data stored in all the first memory cells of every memory cell array block by supplying an erasing voltage to each of said first memory cells, and second erasing means for simultaneously erasing data stored in all the redundant memory cells of said redundant memory cell block by supplying said erasing voltage to each of said redundant memory cells, said first erasing means including a first transfer gate circuit having a first current capability and supplying said erasing voltage to each of said first memory cells through said first transfer gate circuit, said second erasing means including a second transfer gate circuit having a second current capability and supplying said erasing voltage to each of said redundant memory cells through said second transfer gate circuit, said first current capability being larger than said second current capability.

* * * * *